United States Patent [19]

Suzuki et al.

[11] Patent Number: 5,780,900
[45] Date of Patent: Jul. 14, 1998

[54] THIN FILM SILICON-ON-INSULATOR TRANSISTOR HAVING AN IMPROVED POWER DISSIPATION, A HIGH BREAK DOWN VOLTAGE, AND A LOW ON RESISTANCE

[75] Inventors: Yuji Suzuki, Osaka; Hitomichi Takano, Takatsuki; Masahiko Suzumura, Ootsu; Yoshiki Hayasaki, Osaka; Takashi Kishida; Yoshifumi Shirai, both of Hirakata, all of Japan

[73] Assignee: Matsushita Electric Works, Inc., Kadoma, Japan

[21] Appl. No.: 733,164

[22] Filed: Oct. 17, 1996

[30] Foreign Application Priority Data

Jan. 26, 1996 [JP] Japan ............................ 8-012172
Jan. 26, 1996 [JP] Japan ............................ 8-012173

[51] Int. Cl.$^6$ ............................................ H01L 29/10
[52] U.S. Cl. ..................... 257/335; 257/339; 257/343; 257/618; 257/347
[58] Field of Search ........................ 257/335, 339, 257/343, 347, 344, 618

[56] References Cited

U.S. PATENT DOCUMENTS

| | | | |
|---|---|---|---|
| 4,922,327 | 5/1990 | Mena et al. | 257/347 |
| 5,246,870 | 9/1993 | Merchant | 257/347 |
| 5,300,448 | 4/1994 | Merchant et al. | 437/41 |
| 5,338,965 | 8/1994 | Malhi | 257/347 |
| 5,362,979 | 11/1994 | Merchant | 257/340 |
| 5,378,912 | 1/1995 | Pein | 257/335 |
| 5,382,818 | 1/1995 | Pein | 257/347 |
| 5,510,275 | 4/1996 | Malhi | 257/492 |
| 5,548,150 | 8/1996 | Omura et al. | 257/340 |

*Primary Examiner*—David B. Hardy
*Attorney, Agent, or Firm*—Burns, Doane, Swecker & Mathis, L.L.P.

[57] ABSTRACT

A thin film transistor of SOI (Silicon-On-Insulator) type includes a buried oxide layer formed on a semiconductor substrate, a silicon layer of a first conductive type formed on the buried oxide layer, and an upper oxide layer formed on the silicon layer. The silicon layer has a body region of a second conductive type, source region of the first conductive type, drain region of the first conductive type, and a drift region of the first conductive type. The silicon layer is formed with a first portion of a thickness T1 in which the doping region is formed, and a second portion of a thickness T2 in which the body region is formed to reach the buried oxide layer. When the thicknesses T1 and T2 are determined so as to satisfy the relationships:

$0.4 \ \mu m < T1$, $0.4 \ \mu m \leq T2 \leq 1.5 \ \mu m$, and $T2 < T1$,

The transistor exhibits an improved power dissipation, high breakdown voltage, and a low on-resistance, and also provides advantages in a manufacturing process of the transistor.

9 Claims, 6 Drawing Sheets

THIN FILM SILICON-ON-INSULATOR TRANSISTOR HAVING AN IMPROVED POWER DISSIPATION, A HIGH BREAK DOWN VOLTAGE, AND A LOW ON RESISTANCE

BACKGROUND OF THE INVENTION

1. Field of the Invention

The present invention relates to a thin film transistor of SOI (Silicon-On-Insulator) type having an improved power dissipation, high breakdown voltage, and a low on-resistance.

2. Disclosure of the Prior Art

In the past, SOI-LDMOSFET (Lateral Double Diffused Metal Oxide Semiconductor Field Effect Transistor) and IGBD (Insulated Gate Bipolar Transistor) have been known as power transistors. As an example of the SOI-LDMOSFET, U.S. Pat. No. 5,300,448 discloses a high voltage thin film transistor having a linear doping profile, as shown in FIG. 7. The transistor comprises a silicon substrate 10D, a buried oxide layer 20D formed on the silicon substrate, a thin silicon layer 30D formed on the buried oxide layer, and an upper oxide layer 40D. The silicon layer 30D has a source region 33D, body region 31D, drain region 32D, and a drift region 34D in which a linear doping region 35D is formed. In the upper oxide layer 40D, there are a drain electrode 50D contacting the drain region 32D, source electrode 60D contacting the source region 33D, and a gate electrode 70D spaced from the silicon layer 30D by a gate oxide layer 41D.

For example, when a positive voltage is applied to the gate electrode 70D, a channel is formed in the vicinity of a surface of the body region 31D just under the gate electrode, so that electrons flow from source region 33D to the drain region 32D through the channel and the linear doping region 35D to obtain on-state between the source and drain regions. On the other hand, when the positive voltage is removed from the gate electrode 70D or a negative voltage is applied to the gate electrode, the channel disappears to obtain off-state between the source and drain regions.

In general, it is desired that the transistor of this type exhibits a high breakdown voltage between the source region 33D and the drain region 32D, and low on-resistance. As a thickness of the silicon layer 30D is thinner, the breakdown voltage tends to be decreased. This prior art achieves a low on-resistance and high breakdown voltage by forming the linear doping region 35D in the silicon layer 30D having a thickness of 2000 to 3000 angstroms. However, when the silicon layer 30D is thinned, there causes a problem of power dissipation, in other words, heat radiation, of the drift region 34D. It will bring about a thermal runaway or breakage of the transistor. FIG. 2 shows that when a silicon layer is thinned, thermal resistance is increased. That is, it means that the power dissipation is lowered as the silicon layer is thinned.

On the other hand, U.S. Pat. No. 5,246,870 discloses a high voltage thin film transistor, as shown in FIG. 8. The transistor comprises a silicon substrate 10E of n-type or p-type conductivity, a buried oxide layer 20E formed on the silicon substrate, a silicon layer 30E formed on the buried oxide layer, and an upper oxide layer 40E. The silicon layer 30E has a source region 33E of n-type conductivity, body region 31E of p-type conductivity, drain region 32E of n-type conductivity, and a drift region 34E having a lateral linear doping region 35E. The silicon layer 30E is surrounded by isolation regions 80E of an insulating material. The transistor also has a drain electrode 50E contacting the drain region 32E, source electrode 60E contacting both of the body region 31E and source region 33E, and a gate electrode 70E spaced from the silicon layer 30E by a thin gate oxide layer 41E. This prior art achieves a high breakdown voltage between the source and drain regions (33E and 32E) and a low on-resistance by forming the linear doping region 35E in the silicon layer 30E having a thickness of 1000 to 2000 angstroms. In addition, the gate electrode 70E has a field plate 71E short-circuited thereto. Since the field plate 71E overlies the linear doping region 35E, the drift region 34E is protected well from external electric fields and on-resistance is further decreased.

However, since the thickness of the linear doping region 35E in the silicon layer 30E is very thin, this transistor has the same problem as the transistor of U.S. Pat. No. 5,300,448, with respect to the power dissipation.

SUMMARY OF THE INVENTION

The present invention is directed to a thin film transistor of SOI (Silicon-On-Insulator) type for improving the above problems. That is, the transistor comprises a buried oxide layer formed on a semiconductor substrate, a silicon layer of a first conductive type formed on the buried oxide layer, and an upper oxide layer formed on the silicon layer. The silicon layer has a body region of a second conductive type, source region of the first conductive type, drain region of the first conductive type, and a drift region of the first conductive type formed between the source and drain regions. The source region is formed in the body region to be spaced from the buried oxide layer. The transistor also has a source electrode contacting both of the body region and the source region, a drain electrode contacting the drain region, and a gate electrode disposed between the source and drain electrodes and spaced from the silicon layer by a thin oxide layer. In the present invention, the silicon layer is formed with a first portion of a thickness (T1) in which the drift region is formed, and a second portion of a thickness (T2) in which the body region is formed to reach the buried oxide layer. The thicknesses (T1) and (T2) are determined so as to satisfy the following relationships:

$$0.4 \; \mu m < T1$$

$$0.4 \; \mu m \leq T2 \leq 1.5 \; \mu m$$

$$T2 < T1.$$

The present transistor having the above structure exhibits an improved power dissipation, high breakdown voltage, and a low on-resistance, and provides advantages in a manufacturing process of the transistor. When the thickness T1 is less than 0.4 μm, it is not sufficient to improve the power dissipation, i.e., heat radiation, of the drift region. When the thickness T2 is less than 0.4 μm, there causes a problem that the source region is formed in the body region to reach the buried oxide layer because a diffusion depth of the source region can not be suppressed less than around 0.3 μm with conventional silicon process technologies. This lowers the breakdown voltage of the transistor. On the other hand, when the thickness T2 is more than 1.5 μm, it is difficult to efficiently form the body region in the silicon layer. That is, it is necessary to perform a heat-treatment at a high temperature and/or for a long time period to form the body region. This causes a high manufacturing chip cost. In addition, there is a possibility that such a heat-treatment causes variations of transistor properties. Another advantages in the manufacturing process of the present transistor will be explained later in detail.

It is preferred that the thickness T1 of the first portion is 1 μm or more to further improve the power dissipation of the drift region.

In a preferred embodiment of the present invention, the silicon layer is formed on its upper surface with a slope extending from the second portion to the first portion. The body region extends along the slope from the second portion toward the first portion. The gate electrode has a field plate which extends in parallel with the slope and in a spaced relation from the slope by the thin oxide layer. Since an inclined channel is formed in the vicinity of the slope of the body region just under the gate electrode to obtain on-state between the source and drain regions, the transistor can provide a further low on-resistance.

In another preferred embodiment of the present invention, the drift region is formed with a linear doping region. In particular, it is preferred that the gate electrode has a field plate which is short-circuited to the gate electrode, and that the gate electrode and field plate extend laterally in a spaced relation from the silicon layer and without overlying the linear doping region. This provides a higher breakdown voltage between the source and drain regions.

It is preferred that the drain region is spaced from the buried oxide layer. When the body region is formed in the second portion of the silicon layer to reach the buried oxide layer, and the drain region is formed in the silicon layer to be spaced from the buried oxide layer, it is possible to further increase the breakdown voltage.

These and still other objects and advantages will become apparent from the following description of the preferred embodiments of the invention when taken in conjunction with the attached drawings.

BRIEF DESCRIPTION OF THE DRAWINGS

In FIGS. 5A and 5B.

DETAILED DESCRIPTION OF THE EMBODIMENTS

First Embodiment

Figure 1:
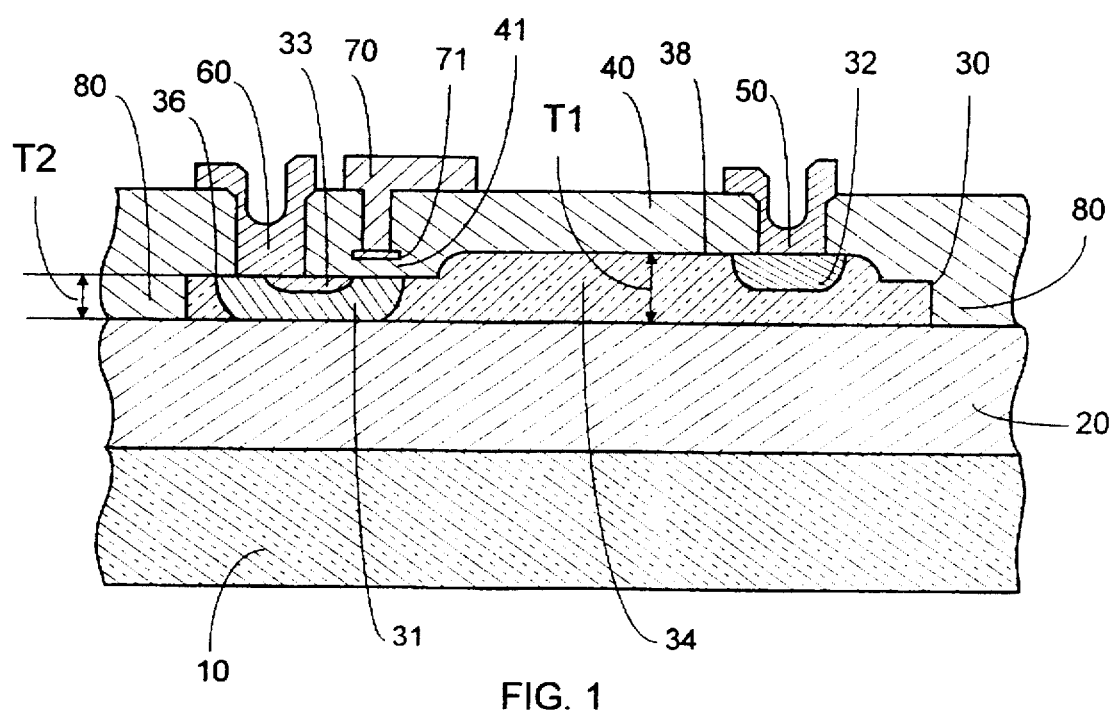
FIG. 1 is a cross-sectional view of a thin film transistor of a first embodiment of the present invention.

As shown in FIG. 1, a thin film transistor of SOI type comprises an n-type silicon substrate 10, buried oxide layer 20 formed on the silicon substrate, n-type silicon layer 30 formed on the buried oxide layer, and an upper oxide layer 40. The silicon layer 30 has a p-type body region 31, n-type drain region 32, n-type source region 33, and a n-type drift region 34. The drift region 34 extends between the body region 31 and drain region 32. The source region 33 is formed in the body region 31. In the upper oxide layer 40, there are a drain electrode 50 contacting the drain region 32, source electrode 60 contacting both of the body region 31 and source region 33, and a gate electrode 70 disposed between the source and drain electrodes and spaced from the silicon layer 30 by a gate thin oxide layer 41. The gate electrode 70 has a field plate 71 short-circuited to the gate electrode. The silicon layer 30 is formed with a first portion 38 having a thickness T1 and a second portion 36 having a thickness T2. In this embodiment, the thicknesses T1 and T2 are 1.0 μm and 0.5 μm, respectively. The drift region 34 extends laterally in the first portion 38. The drain region 32 is also formed in the first portion 38 to be spaced from the buried oxide layer 20. The body region 31 and source region 33 are formed in the second portion 36 such that the body region reaches the buried oxide layer 20 to increase the breakdown voltage between the drain and source regions, and the source region 33 is spaced from the buried oxide layer 20.

When a positive voltage is applied to the gate electrode 70, an n-type channel is formed in the vicinity of a surface of the body region 31 just under the gate electrode 70, so that electrons flow from the source region 33 to the drain region 32 through the channel and the drift region 34 to obtain on-state between the source and drain regions. On the other hand, when the positive voltage is removed from the gate electrode 70 or a negative voltage is applied to the gate electrode, the channel disappears to obtain off-state between the source and drain regions.

Figure 2:
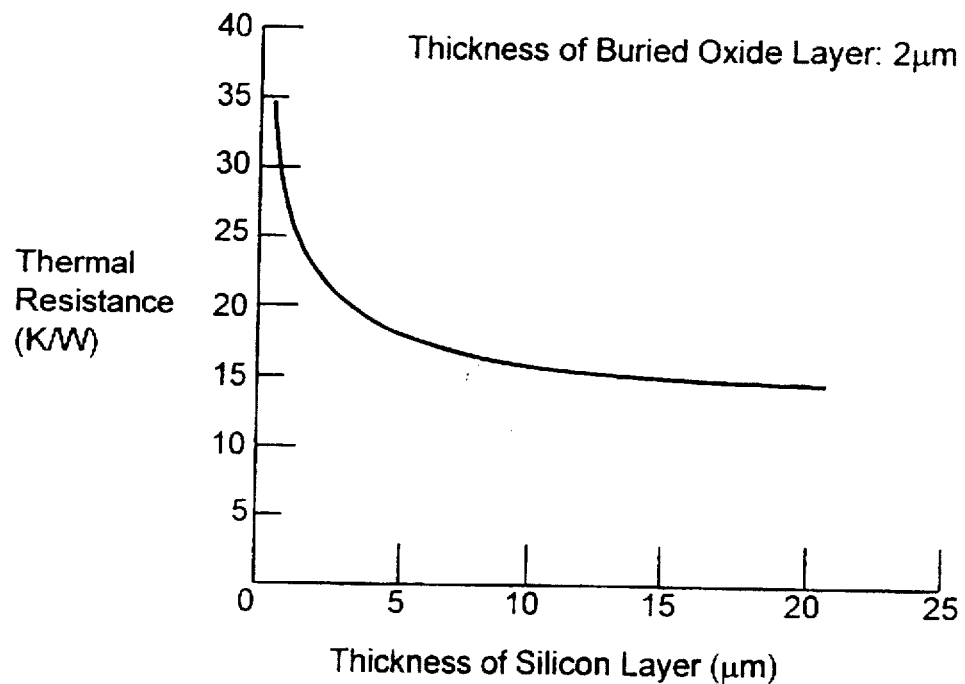
FIG. 2 shows a relationship between thermal resistance and thickness of a silicon layer.

A relationship between thermal resistance and thickness of a silicon layer is shown in FIG. 2. It shows that as the silicon layer 30 is thinned, the thermal resistance is increased. Therefore, as the thickness T1 of the first portion 38 is thinner, the power dissipation of drift region 34 is decreased. When the thickness T1 is less than 0.4 μm, there is a possibility of causing a thermal runaway of the transistor. In this embodiment, the thickness T1 is determined at 1 μm to improve the power dissipation. When the thickness T1 is increased more than 0.4 μm, the power dissipation of the drift region 34 can be improved. In addition, when the thickness T1 is increased in the range of more than 0.4 μm and less than 5 μm, the on-resistance of the transistor is lowered.

Figure 3:
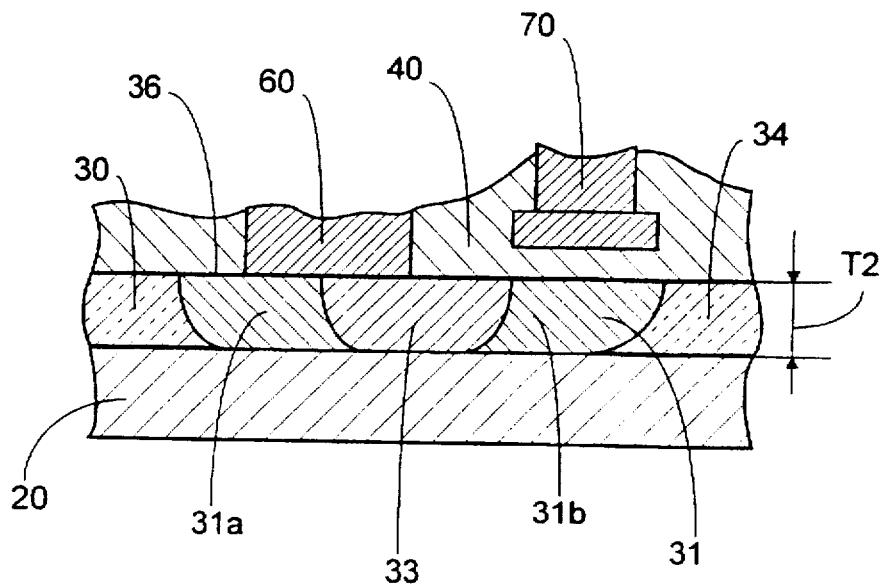
FIG. 3 is a cross-sectional view of a part of a silicon layer having a thickness (T2) less than 0.4 μm.

When the thickness T2 of the second portion 36 is less than 0.4 μm, there causes a problem that the source region 33 is formed in the body region 31 to reach the buried oxide layer 20 because a diffusion depth of the source region can not be suppressed less than around 0.3 μm with conventional silicon process technologies. That is, as shown in FIG. 3, when the thickness T2 is less than 0.4 μm, the body region 31 is divided into a first sub-region 31a contacting with the source electrode 60 and a second sub-region 31b faced to the gate electrode 70 by the source region 33 extending between the source electrode 60 and the buried oxide layer 20. In this case, since the second sub-region 31b is kept in an electrically floating state, the breakdown voltage of the transistor is lowered.

Figure 4:
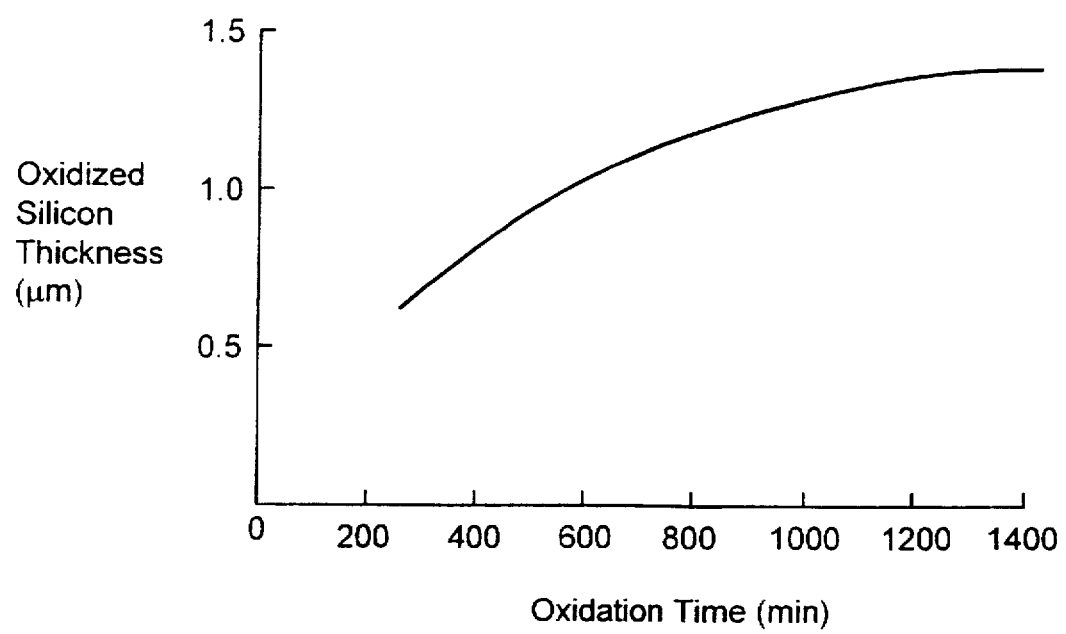
FIG. 4 shows a relationship between oxidized silicon thickness and oxidation time for forming an isolation region by a LOCOS method.

When the thickness T2 of the second portion 36 is more than 1.5 μm, there cause the following problems in the manufacturing process of the transistor. That is, the transistor usually has an isolation region 80 which is formed outwardly of the second portion 36 to electrically insulate the silicon layer 30 from a device to be mounted adjacent to the transistor. The isolation region 80 can be formed by a LOCOS (Local Oxidation of Silicon) method. The LOCOS method comprises the steps of forming a silicon nitride film on a silicon substrate along a predetermined pattern, and then heat-treating the silicon substrate in an oxidizing atmosphere. Since oxygen atoms can not diffuse into the silicon substrate through the silicon nitride film during the heat-treatment, an exposed silicon surface of the silicon substrate is selectively oxidized. When the isolation region 80 is formed by the LOCOS method, oxidation of silicon is performed over the thickness T2 of the silicon layer 30 adjacent to the isolation region. Therefore, when the thickness T2 is increased, a longer oxidation time is needed to form the isolation region 80. For example, FIG. 4 shows a relationship between oxidized silicon thickness and oxidation time for forming an isolation region by the LOCOS method, which was measured at an oxidation temperature of 1100° C. It shows that as the oxidation time is extended, the oxidized silicon thickness is gradually increased and is saturated at about 1.5 μm. From this relationship, it could be understood that it is difficult to form the isolation region having a thickness more than 1.5 μm at 1100° C. of the standard oxidation temperature adopted in the LOCOS method. Therefore, the thickness T2 of the second portion 36 is determined at 1.5 μm or less to efficiently and readily form the isolation region 80 adjacent to the silicon layer 30.

In addition, the silicon nitride film used in the LOCOS method is gradually oxidized during the oxidation treatment. Therefore, as a thickness of an isolation region is increased, a thicker silicon nitride film is needed to prevent oxidation of silicon just under the silicon nitride film. However, there are problems that it takes a long deposition time period to form the thick silicon nitride film, and that cracks of the thick silicon nitride film or warp of SOI wafer may be caused by a large internal stress of the thick silicon nitride film. Therefore, the thickness T2 of the second portion 36 is determined at 1.5 μm or less to prevent the occurrence of these problems.

Moreover, when an isolation region is formed by the LOCOS method, a silicon layer lying just under a peripheral portion of the silicon nitride film tends to be partially oxidized. The oxidized area of the silicon layer is usually known as "bird's beak". The bird's beak area is enlarged as a thickness of the isolation region is increased. The occurrence of stress concentration or lattice defects in the enlarged bird's beak area will have a bad effect upon the transistor properties. In the present invention, the thickness T2 of the second portion 36 is determined at 1.5 μm or less to control the formation of the bird's beak area at the minimum.

Additionally, since the body region 31 is formed in the second portion 36 of the silicon layer 30 to reach the buried oxide layer 20, it is necessary to perform a heat-treatment at a higher temperature and/or for a longer time period to form the body region 31 when the thickness T2 is more than 1.5 μm. In addition, there is a possibility that such a heat-treatment causes variations of the transistor properties. Therefore, to efficiently and stably form the body region 31 in the silicon layer 30, the thickness T2 of the second portion 36 is determined at 1.5 μm or less.

In conclusion, since the silicon layer 30 is formed with the first portion 38 having the thickness T1 more than 0.4 μm, and the second portion 36 having the thickness T2 which is determined in the range of 0.4 μm to 1.5 μm and less than the thickness T1, the present transistor can provide the following advantages:

(1) The drift region 34 formed in the first portion 38 exhibits an improved power dissipation, high breakdown voltage, and a low on-resistance;

(2) The body region 31 can be efficiently and readily formed in the second portion 36 to reach the buried oxide layer 20 by a heat-treatment of a reduced temperature for a shortened time period; and (3) The isolation region 80 can be readily formed adjacent to the second portion 36 without using a thick silicon nitride film in the LOCOS method and while controlling the bird's beak area at the minimum.

Second Embodiment

Figure 5A:
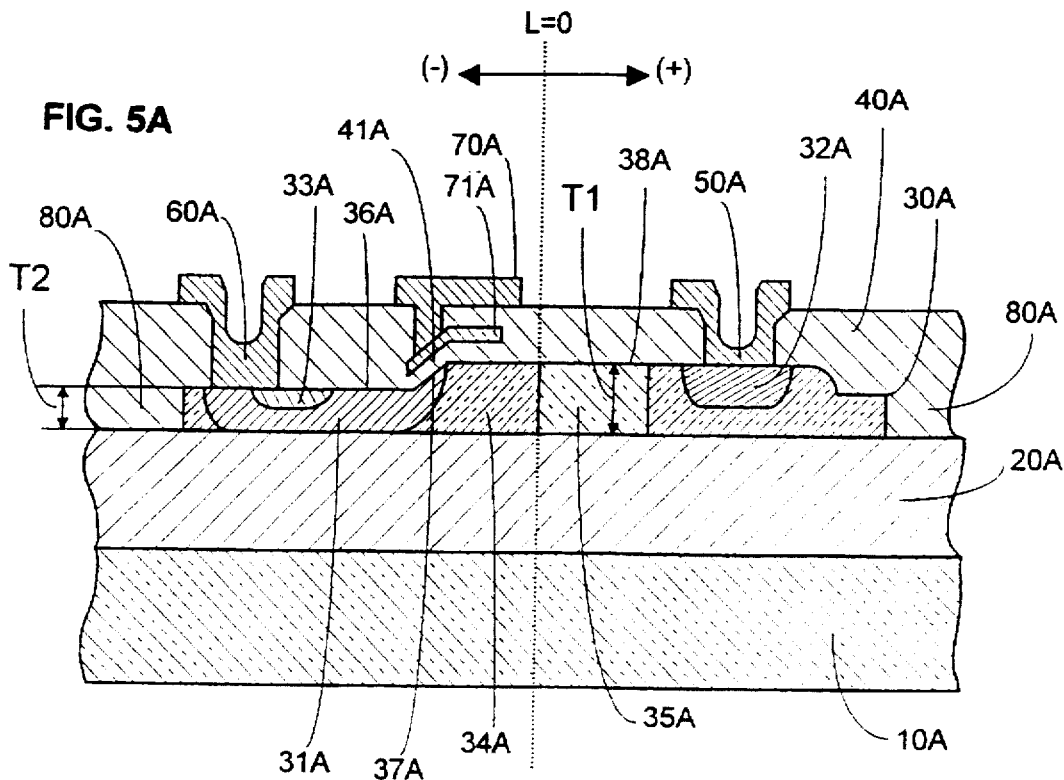
FIG. 5A is a cross-sectional view of a thin film transistor of a second embodiment of the present invention.

A thin film transistor of SOI type of the second embodiment is substantially a same structure as the transistor of the first embodiment except for the following features, as shown in FIG. 5A. Therefore, no duplicate explanation to common parts and operation is deemed necessary. Like parts are designated by like numerals with a suffixed letter of "A".

Figure 5B:
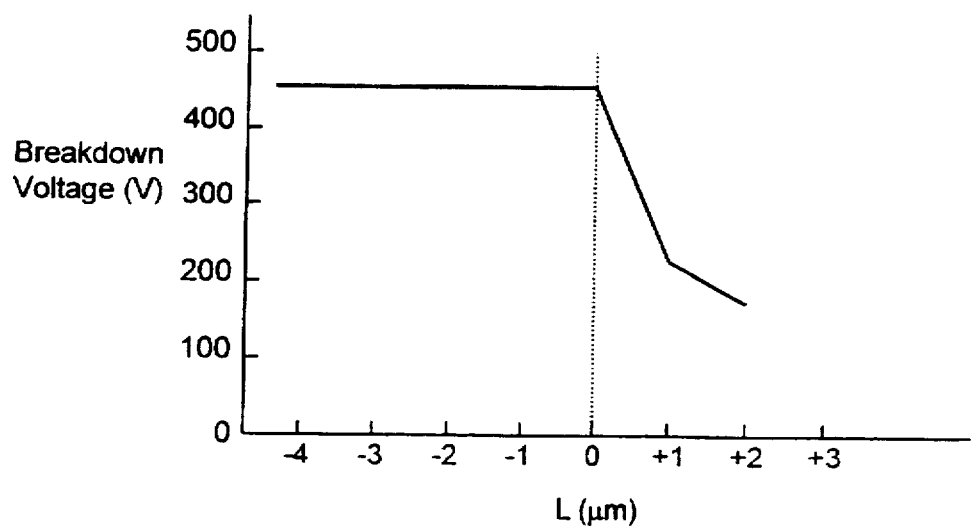
FIG. 5B shows a relationship between breakdown voltage V and lateral distance L between a field plate and a lateral linear doping region of FIG. 5A.

An n-type drift region 34A is formed in a first portion 38A having a thickness T1 of 1.0 μm. The drift region 34A has a linear doping region 35A extending laterally of the first portion 38A. A doping concentration of the doping region 35A is gradually increased in a direction from a p-type body region 31A toward an n-type drain region 32A. The doping region 35A can be formed by a method described in U.S. Pat. No. 5,300,448. A gate electrode 70A is formed in an upper oxide layer 40A, and has a field plate 71A short-circuited to the gate electrode. The gate electrode 70A and field plate 71A extend laterally of the upper oxide layer 40A in a spaced relation from a silicon layer 30A and without overlying the doping region 35A, as shown in FIG. 5A. A relationship between breakdown voltage V and lateral distance L between the doping region 35A and the gate electrode 70A having the field plate 71A is shown in FIG. 5B. When the distance L is expressed by a negative value, it means that both of the gate electrode 70A and field plate 71A is displaced laterally from the doping region 35A by the distance L. The breakdown voltage is maintained at about 450 V within the negative distance L. On the other hand, when the distance L is expressed by a positive value, it means that at least one of the gate electrode 70A and field plate 71A overlies the doping region 35A by the distance L. FIG. 5B shows that the breakdown voltage is rapidly decreased when the positive distance L is increased. Therefore, when the doping region 35A is formed in the drift region 34A, it is preferred that both of the gate electrode 70A and field plate 71A extend laterally of the upper oxide layer 40A without overlying the doping region 35A.

The silicon layer 30A is formed on its upper surface with a slope 37A extending from a second portion 36A having a thickness T2 of 0.5 μm to the first portion 38A having the thickness T1. The body region 31A extends along the slope 37A from the second portion 36A toward the first portion 38A, and reaches a buried oxide layer 20A. The field plate 71A extends in parallel with the slope 37A, and is spaced from the body region 31A by a thin oxide layer 41A. When a positive voltage is applied to the gate electrode 70A, an inclined channel is formed in the vicinity of a surface of the body region 31A along the slope 37A, so that electrons flow from an n-type source region 33A to the drain region 32A through the inclined channel and doping region 35A to obtain on-state between the source and drain regions. The inclined channel decreases on-resistance of the transistor. In addition, when the body region 31A is formed in the silicon layer 30A to reach the buried oxide layer 20A, and the drain region 32A extends in the silicon layer 30A to be spaced from the buried oxide layer 20A, the breakdown voltage between the source and drain regions can be further increased.

Figure 6:
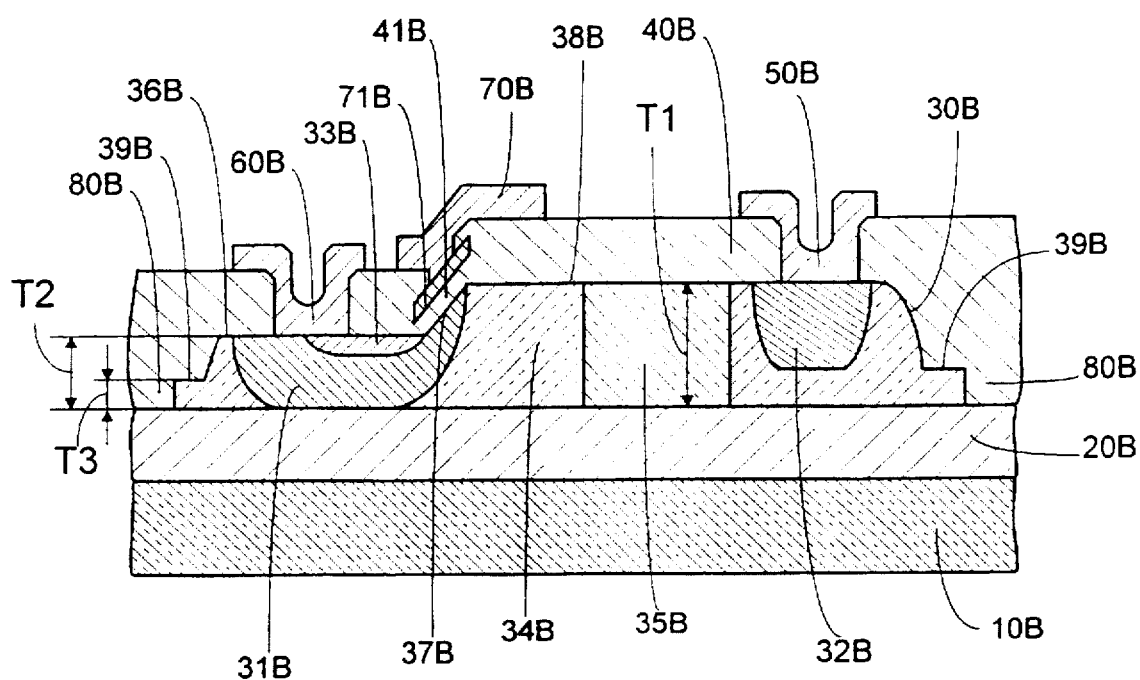
FIG. 6 is a cross-sectional view of a thin film transistor of a modification of the second embodiment.
Figure 7:
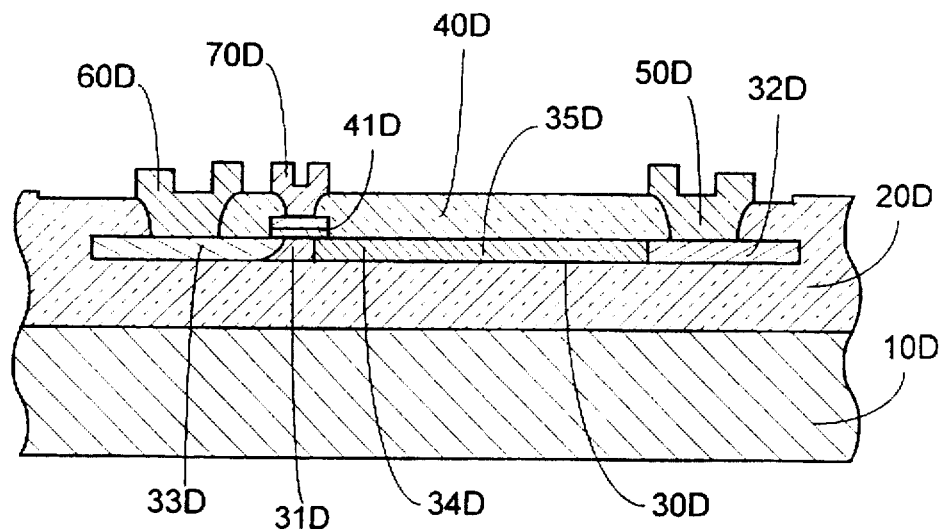
FIG. 7 is a cross-sectional view of a thin film transistor of the prior art.
Figure 8:
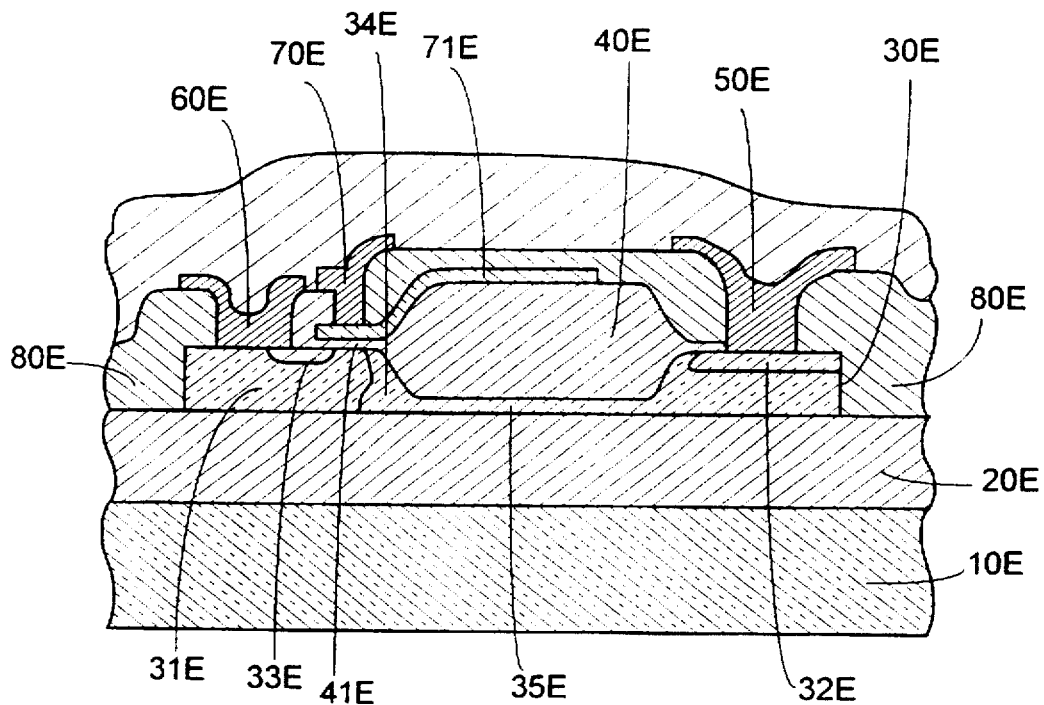
FIG. 8 is a cross-sectional view of a thin film transistor of the prior art.

As a modification of the second embodiment, a third portion 39B having a thickness T3 of 0.5 μm may be formed laterally and outwardly of a second portion having a thickness T2 of 0.8 μm of a silicon layer 30B, as shown in FIG. 6. A thin film transistor of this modification is substantially a same structure as the transistor of the second embodiment except for the following features. Therefore, no duplicate explanation to common parts and operation is deemed necessary. Like parts are designated by like numerals with a suffixed letter of "B".

An n-type drift region 34B, lateral linear doping region 35B, and an n-type drain region 32B are formed in a first portion 38B having a thickness T1 of 1.4 μm of the silicon layer 30B. A p-type body region 31B is formed in the second portion 36B. In this modification, since isolation regions 80B are formed adjacent to the third portion 39B having the thickness T3 smaller than the thickness T2, it is possible to enhance the formation of the isolation regions 80B by a LOCOS method.

In each of the above embodiments, an SOI substrate obtained by a grinding and polishing of bonded SOI substrate is used. In place of the SOI substrate, however, it is possible to use an SOI substrate formed by SIMOX (Separation by Implanted Oxygen), BE(Bonded and Etched)-SOI substrate, SOI substrate formed by epitaxially growing a single crystal silicon on an insulating substrate, or an SOI substrate formed by Smart Cut technologies.

What is claimed is:

1. A thin film transistor of silicon-on-insulator type comprising:

a buried oxide layer formed on a semiconductor substrate;

a silicon layer of a first conductive type formed on said buried oxide layer, said silicon layer having a body region of a second conductive type, source region of said first conductive type, drain region of said first conductive type, and a drift region of said first conductive type formed between said source and drain regions, said source region being formed in said body region to be spaced from said buried oxide layer, and said drift region being formed with a lateral linear doping region;

an upper oxide layer formed on said silicon layer;

a source electrode contacting both of said body region and said source region;

a drain electrode contacting said drain region; and a gate electrode disposed between said source and drain electrodes and spaced from said silicon layer by a thin oxide layer, said gate electrode having a field plate which is short-circuited to said gate electrode, and said gate electrode and field plate extending laterally in a spaced relation from said silicon layer without overlying said linear doping region, wherein said silicon layer is formed with a first portion of a thickness (T1) in which said drift region is formed, and a second portion of a thickness (T2) in which said body region is formed to reach said buried oxide layer, and wherein said thicknesses (T1) and (T2) are determined so as to satisfy the following relationships:

0.4 μm<T1

0.4 μm≦T2≦1.5 μm

T2<T1.

2. A thin film transistor as set forth in claim 1, wherein said first and second conductive types are n-type and p-type, respectively.

3. A thin film transistor as set forth in claim 1, wherein said thickness (T1) is 1 μm or more.

4. A thin film transistor as set forth in claim 1, wherein said drain region is formed in said silicon layer to be spaced from said buried oxide layer.

5. A thin film transistor of silicon-on-insulator type comprising:

a buried oxide layer formed on a semiconductor substrate;

a silicon layer of a first conductive type formed on said buried oxide layer, said silicon layer having a body region of a second conductive type, source region of said first conductive type, drain region of said first conductive type, and a drift region of said first conductive type formed between said source and drain regions, said source region being formed in said body region to be spaced from said buried oxide layer;

an upper oxide layer formed on said silicon layer;

a source electrode contacting both of said body region and said source region;

a drain electrode contacting said drain region; and a gate electrode disposed between said source and drain electrodes and spaced from said silicon layer by a thin oxide layer;

wherein said silicon layer is formed with a first portion of a thickness (T1) in which said drift region is formed, and a second portion of a thickness (T2) in which said body region is formed to reach said buried oxide layer, said thicknesses (T1) and (T2) being determined so as to satisfy the following relationships:

0.4 μm<T1

0.4 μm≦T2≦1.5 μm

T2<T1; and wherein said silicon layer is formed on its upper surface with a slope extending from said second portion to said first portion, said body region extending along said slope from said second portion toward said first portion, and said gate electrode having a field plate which extends in parallel with said slope and in a spaced relation from said slope by said thin oxide layer.

6. A thin film transistor as set forth in claim 5, wherein said first and second conductive types are n-type and p-type, respectively.

7. A thin film transistor as set forth in claim 5, wherein said drift region is formed with a lateral linear doping region.

8. A thin film transistor as set forth in claim 5, wherein said thickness (T1) is 1 μm or more.

9. A thin film transistor as set forth in claim 5, wherein said drain region is formed in said silicon layer to be spaced from said buried oxide layer.

* * * * *